United States Patent
Morita et al.

(10) Patent No.: US 7,432,476 B2
(45) Date of Patent: Oct. 7, 2008

(54) SUBSTRATE HEAT TREATMENT APPARATUS

(75) Inventors: Akihiko Morita, Kyoto (JP); Shigehiro Goto, Kyoto (JP); Keiji Matsuchika, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 161 days.

(21) Appl. No.: 11/417,691

(22) Filed: May 3, 2006

(65) Prior Publication Data

US 2006/0289432 A1    Dec. 28, 2006

(30) Foreign Application Priority Data

May 12, 2005    (JP)    ............ 2005-139567

(51) Int. Cl.
*H05B 3/68* (2006.01)
*C23C 16/00* (2006.01)

(52) U.S. Cl. .................... 219/444.1; 118/725

(58) Field of Classification Search ... 219/443.1–468.2; 118/723 VE, 724, 725; 432/81, 253; 392/416, 392/418
See application file for complete search history.

(56) References Cited

U.S. PATENT DOCUMENTS

| | | | | |
|---|---|---|---|---|
| 4,949,783 A | * | 8/1990 | Lakios et al. ............ | 165/80.1 |
| 5,096,536 A | * | 3/1992 | Cathey, Jr. .............. | 438/715 |
| 5,761,023 A | * | 6/1998 | Lue et al. ............... | 361/234 |
| 6,394,797 B1 | | 5/2002 | Sugaya et al. | |
| 6,634,882 B2 | * | 10/2003 | Goodman ................ | 432/253 |
| 6,761,771 B2 | * | 7/2004 | Satoh et al. ............. | 118/725 |

FOREIGN PATENT DOCUMENTS

| | | |
|---|---|---|
| JP | 2-290013 | 11/1990 |
| JP | 10-284360 | 10/1998 |
| JP | 2000-193376 | 7/2000 |

* cited by examiner

*Primary Examiner*—Sang Y Paik
(74) *Attorney, Agent, or Firm*—Ostrolenk, Faber, Gerb & Soffen, LLP

(57) ABSTRACT

A substrate heat treatment apparatus for heat-treating a substrate includes a bake plate having projections on an upper surface thereof, a seal unit disposed peripherally of the upper surface of the bake plate for closing a lateral area of a minute space formed between a lower surface of the substrate and the upper surface of the bake plate when the substrate is placed on the bake plate, and exhaust bores for exhausting gas from the minute space. The substrate placed on the bake plate is heat-treated in a state of the gas exhausted from the minute space through the exhaust bores.

20 Claims, 14 Drawing Sheets

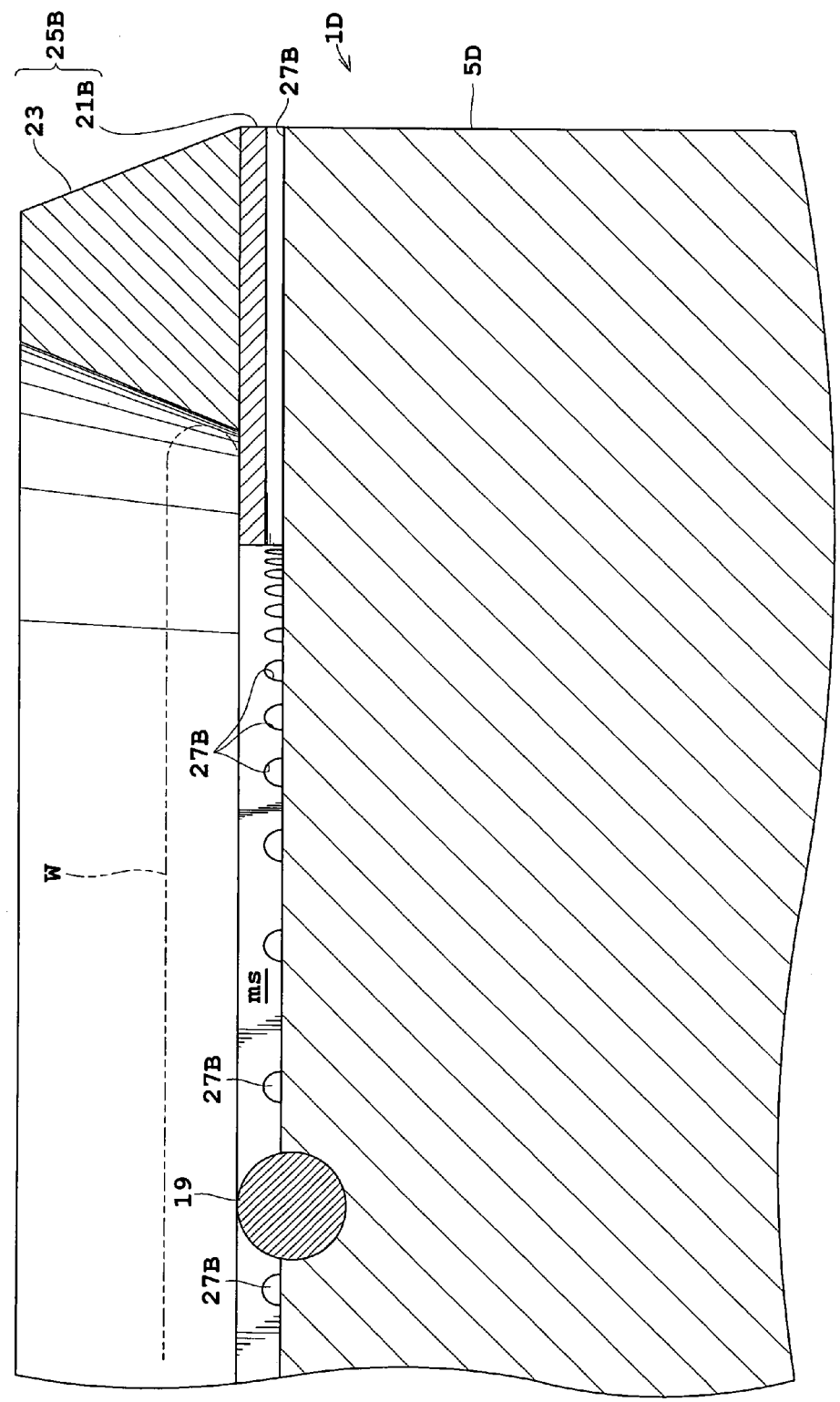

SUBSTRATE HEAT TREATMENT APPARATUS

BACKGROUND OF THE INVENTION (1) Field of the Invention

This invention relates to a substrate heat treatment apparatus for heat-treating substrates such as semiconductor wafers and glass substrates for liquid crystal displays (hereinafter simply called substrates). More particularly, the invention relates to a technique for heat-treating a substrate slightly spaced from a bake plate instead of being in contact with the plate.

(2) Description of the Related Art

A conventional apparatus of the type noted above has a bake plate variable in temperature, and three balls arranged on an upper surface of the bake plate to be located at apexes of an equilateral triangle in plan view (as disclosed in Japanese Unexamined Patent Publication No. 2000-193376, for example). With this apparatus, a substrate placed on the bake plate is supported at a lower surface thereof by the three balls, so that the entire lower surface is separated by a minute space from the bake plate instead of contacting the latter. By placing the substrate as separated by the minute space from the bake plate, the substrate is least affected by temperature variations occurring with the bake plate.

Heating treatment of substrates is an essential part of the semiconductor manufacturing process. Heating treatment carried out before development in the mask forming process using photoresist is also an important matter having a great influence on the accuracy of an etching mask size. With the processes becoming increasingly refined today, a high degree of temperature uniformity is required of the substrate heat treatment apparatus. Various improvements have been made to meet such requirements.

However, various films having different physical properties are combined into a multilayer structure in the actual semiconductor manufacturing process. With progress of the process, the substrate itself usually becomes curved (in the direction of thickness) due to differences in the rate of thermal contraction and expansion of the films. Thus, however accurately uniform a temperature distribution may be made over the surface of the bake plate, when a substrate is actually heated in the semiconductor manufacturing process, the minute space between the bake plate and substrate cannot be uniform over the entire surface of the substrate, but becomes uneven. This results in a problem that the heat treatment of the substrate is conducted without making full use of the highly precise temperature uniformity intrinsic to the bake plate.

In order to solve the above problem, a proposal has been made to divide temperature control of the bake plate into a plurality of areas, and to perform a different heating control for each area according to a distance between the substrate and bake plate. However, since the amount and direction of curvature of the substrate are not uniform, optimal temperature control must be carried out for each different substrate. Such control is difficult in actual situations. Even if it is actually practiced, the uniformity of heat treatment of substrates cannot be improved for all the complication of control.

SUMMARY OF THE INVENTION

This invention has been made having regard to the state of the art noted above, and its object is to provide a substrate heat treatment apparatus which corrects a curvature of a substrate by suction, for performing uniform heat treatment over an entire surface of the substrate.

A substrate heat treatment apparatus for heat-treating a substrate, according to this invention, comprises a bake plate having projections on an upper surface thereof, a seal unit disposed peripherally of the upper surface of the bake plate for closing a lateral area of a minute space formed between a lower surface of the substrate and the upper surface of the bake plate when the substrate is placed on the bake plate; and exhaust bores for exhausting gas from the minute space; wherein the substrate placed on the bake plate is heat-treated in a state of the gas exhausted from the minute space through the exhaust bores.

According to this invention, the seal unit closes the lateral area (periphery) of the minute space between the lower surface of the substrate and the upper surface of the bake plate. When gas is exhausted from minute space through the exhaust bores, a negative pressure is produced in the minute space, and the substrate surface is drawn by this negative pressure toward the bake plate. Any curvature of the substrate is thereby corrected, and the lower surface of the substrate in contact with the projections is maintained at an appropriate distance to the upper surface of the bake plate. Consequently, uniform heat treatment is performed over the entire surface of the substrate.

The exhaust bores may open to the upper surface of the bake plate.

Where the exhaust bores open to the upper surface of the bake plate, suction may easily be applied to the substrate surface to draw the substrate toward the bake plate. This realizes an efficient sucking action.

The exhaust bores may be formed in positions closer to the seal unit than to a central part of the bake plate.

Since the central part of the substrate is easily curved by suction, when the central part is drawn first to form a closed space, the negative pressure in the minute space adjacent the periphery of the substrate may remain low. Then, there is a possibility that the periphery of the substrate is not fully drawn. Since the exhaust bores are formed outwardly from the central part of bake plate, the entire surface of the substrate is drawn substantially equally, so that uniform heat treatment may be performed.

In this invention, the seal unit may have a support portion for contacting to the lower surface of the substrate to maintain the lower surface level with the projections, and a regulator disposed on the support portion for restricting sideways movement of the substrate, the support portion including a contact portion having a diameter smaller than an outside diameter of the substrate for contacting the lower surface of the substrate, and a groove formed outwardly of the contact portion for remaining out of contact with the lower surface of the substrate.

When the substrate is placed in the apparatus, the support portion of the seal unit supports the periphery of the lower surface of the substrate at the height of the projections, and the regulator restricts sideways movement of the substrate, thereby preventing displacement of the substrate. Further, there is a possibility that the treating liquids and other substances from various processes have flowed round to and remain on the periphery of the lower surface of the substrate. When the substrate is sucked with such liquids and substances adhering to the support portion it may be difficult to separate the periphery of the substrate from the support portion upon cancellation of the suction. Thus, the contact portion smaller than the outside diameter of the substrate contacts and supports the lower surface of the substrate, and the groove maintains, out of contact, the periphery of the lower surface of the substrate possibly having the liquids and substances. Consequently, the substrate is readily separable from the seal unit even if the treating liquids and the like remain adhering to the periphery of the lower surface of the substrate.

The apparatus according to this invention may further comprise feed bores for feeding a gas to the minute space, wherein the gas is fed from the feed bores and the exhaust from the exhaust bores is stopped after finishing heat treatment of the substrate.

When a gas were supplied through the exhaust bores having exhausted the gas from the minute space, in order to cancel the suction in the minute space to release the substrate, particles and the like could be blown upward toward the lower surface of the substrate to contaminate the substrate. Thus, the feed bores different from the exhaust bores are provided as above. When canceling the suction, the negative pressure in the minute space is positively canceled by first supplying the gas through the feed bores and thereafter the exhaust through the exhaust bores is stopped. This process effectively prevents the blowing-up of particles and the like, thereby treating the substrate in a highly clean condition. Further, by the influence of the treating liquids having flowed round to the lower surface of the substrate, the substrate may stick to the seal unit, making it difficult to separate the substrate even after the negative pressure is canceled. However, the gas is positively supplied to apply a pressure for raising the substrate, whereby the substrate is separated with ease.

The apparatus according to this invention may further comprise an exhaust pressure detecting device for detecting an exhaust pressure in the exhaust bores; a determining device for determining an abnormality of an exhaust system based on the exhaust pressure obtained from the exhaust pressure detecting device; and a reporting device for reporting the abnormality determined by the determining device.

The exhaust pressure detecting device detects an exhaust pressure. When the determining device determines an abnormality having occurred with the exhaust system based on the exhaust pressure, the reporting device reports the abnormality. Thus, it is possible to make known beforehand a situation where the heat treatment of the substrate becomes uneven because the minute space cannot be maintained at a sufficiently negative pressure due to the abnormality of the exhaust system. This prevents improper treatment being performed continuously.

The apparatus according to this invention may further comprise a switching device for switching an exhaust pressure from the exhaust bores, such that an exhaust pressure from the minute space is increased to be higher in early stages of exhaust than a subsequent exhaust pressure in time of steady state.

The greater exhaust pressure results in the greater suction applied to the substrate. However, a gas flow could make the heat distribution over the bake plate uneven. On the other hand, when the substrate is curved to have the periphery located higher than the central part, a large gap is formed between the seal unit and the periphery of the substrate. Unless the exhaust pressure is increased, the periphery of the substrate may not be sucked sufficiently. Thus, the exhaust pressure is increased to be higher in early stages of exhaust than the subsequent exhaust pressure in time of steady state. This exhaust mode can reliably suck even a substrate curved to have the central part thereof bulging downward, and yet has no adverse influence on the heat distribution of bake plate.

In another aspect of the invention, a substrate heat treatment apparatus for heat-treating a substrate comprises a bake plate having projections on an upper surface thereof; a seal unit disposed peripherally of the upper surface of the bake plate for closing a lateral area of a minute space formed under a lower surface of the substrate when the substrate is placed on the bake plate; a porous member disposed on the upper surface of the bake plate inwardly of the seal unit; and exhaust bores communicating with the porous member for exhausting gas from the minute space; wherein the substrate placed on the bake plate is heat-treated in a state of the gas exhausted from the minute space through the exhaust bores.

With this construction, the seal unit closes the side of minute space between the lower surface of the substrate and the upper surface of the bake plate. When gas is exhausted from the minute space through the exhaust bores, a negative pressure is produced by the gas leaving an entire expanse under the minute space through the porous member. The negative pressure draws the substrate toward the bake plate. Thus, any curvature of the substrate is leveled, so that the lower surface of the substrate contacts the projections to be maintained at an appropriate distance to the upper surface of the bake plate, whereby uniform heat treatment is effected over the entire surface of the substrate. Moreover, since the exhaust is effected in a planar form through the porous member, the gas is exhausted generally and evenly from the minute space. As a result, an uneven heat distribution is little likely to occur with the bake plate, thereby realizing heat treatment of increased uniformity.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

FIG. 16 is an enlarged view in vertical section of a portion of a substrate heat treatment apparatus in Embodiment 8.

DESCRIPTION OF THE PREFERRED EMBODIMENTS

Embodiment 1

Embodiment 1 of this invention will be described hereinafter with reference to the drawings.

Figure 1:
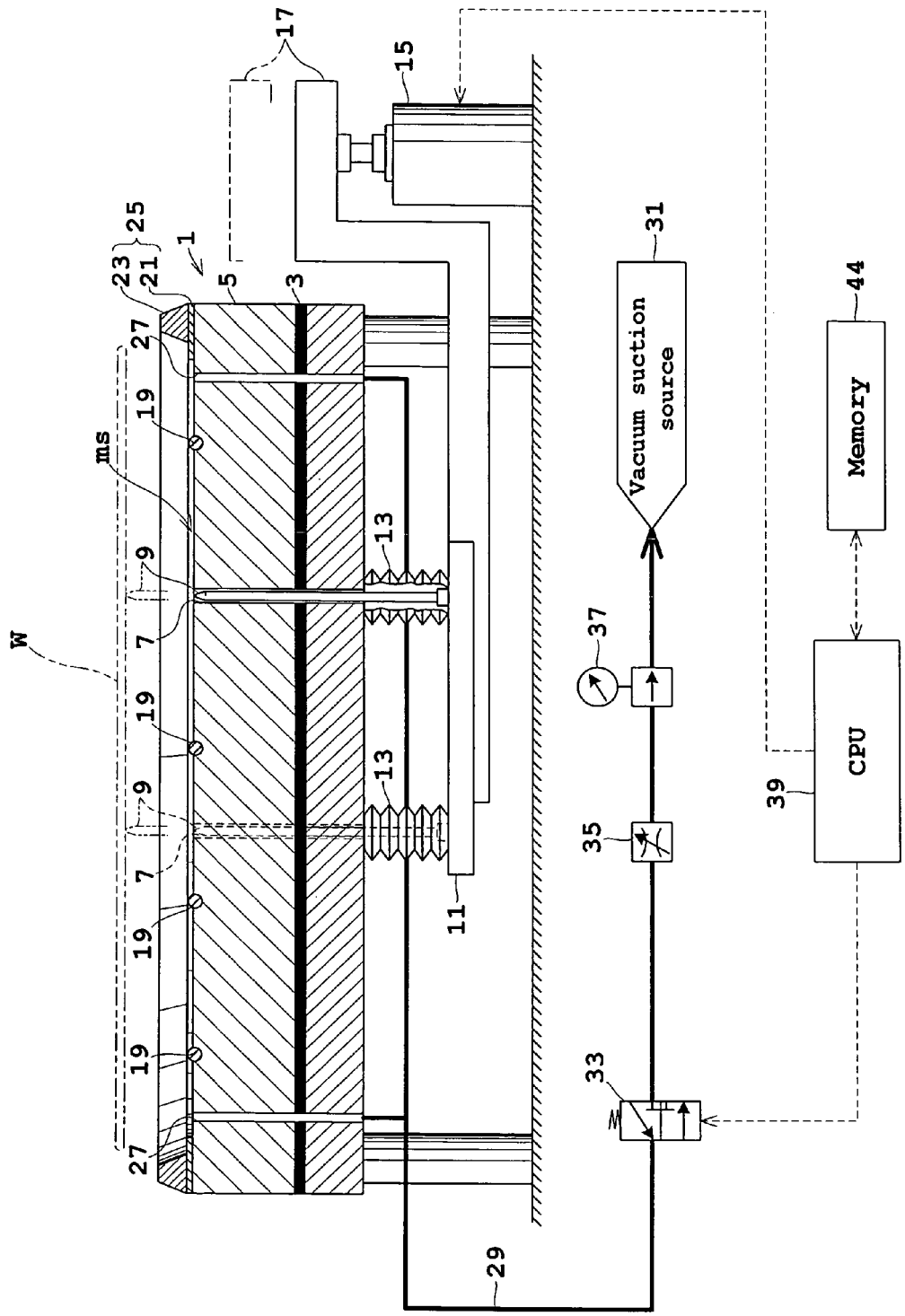
FIG. 1 is a view in vertical section showing an outline of a substrate heat treatment apparatus in Embodiment 1.
Figure 2:
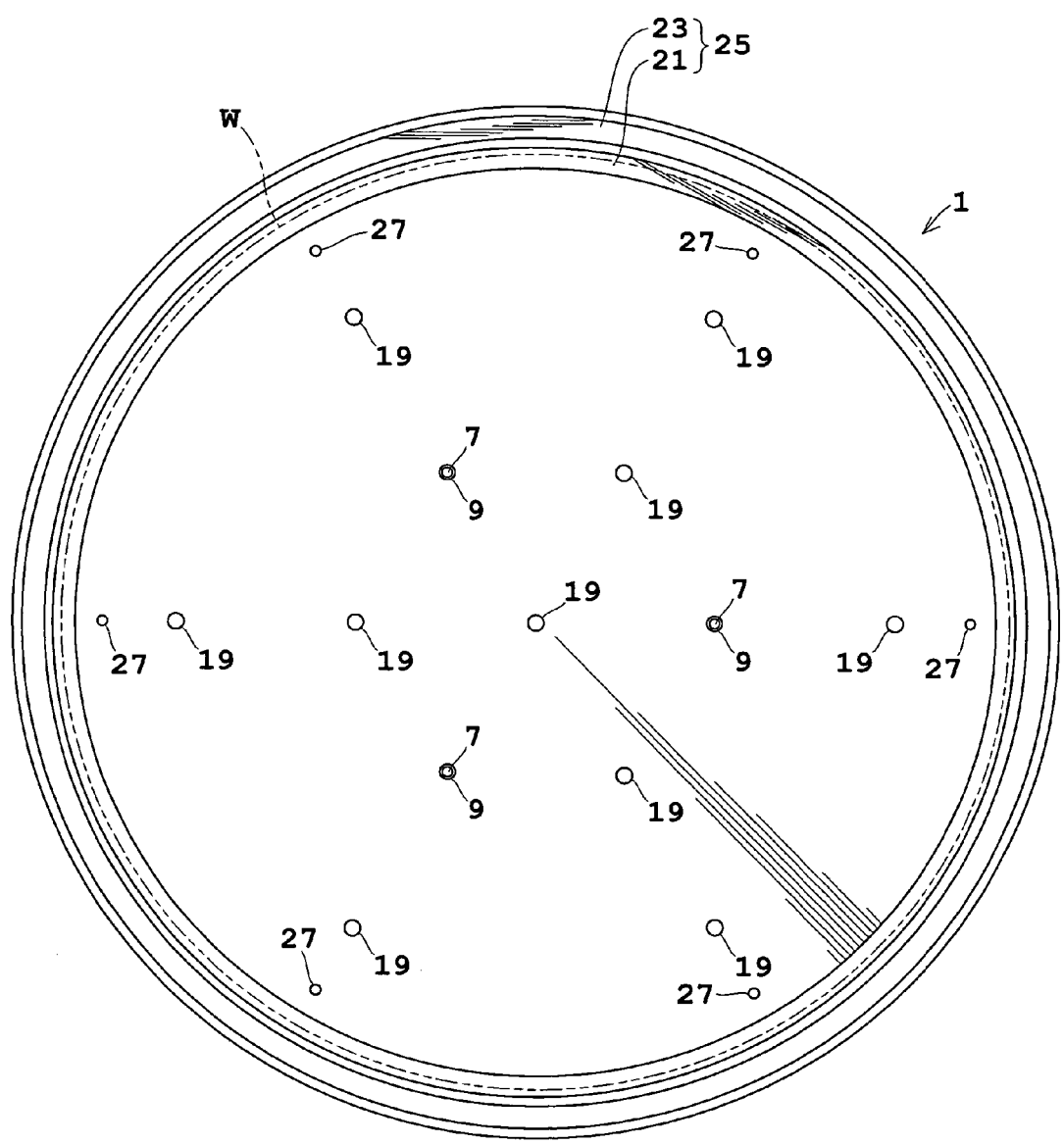
FIG. 2 is a plan view of the apparatus shown in FIG. 1.
Figure 3:
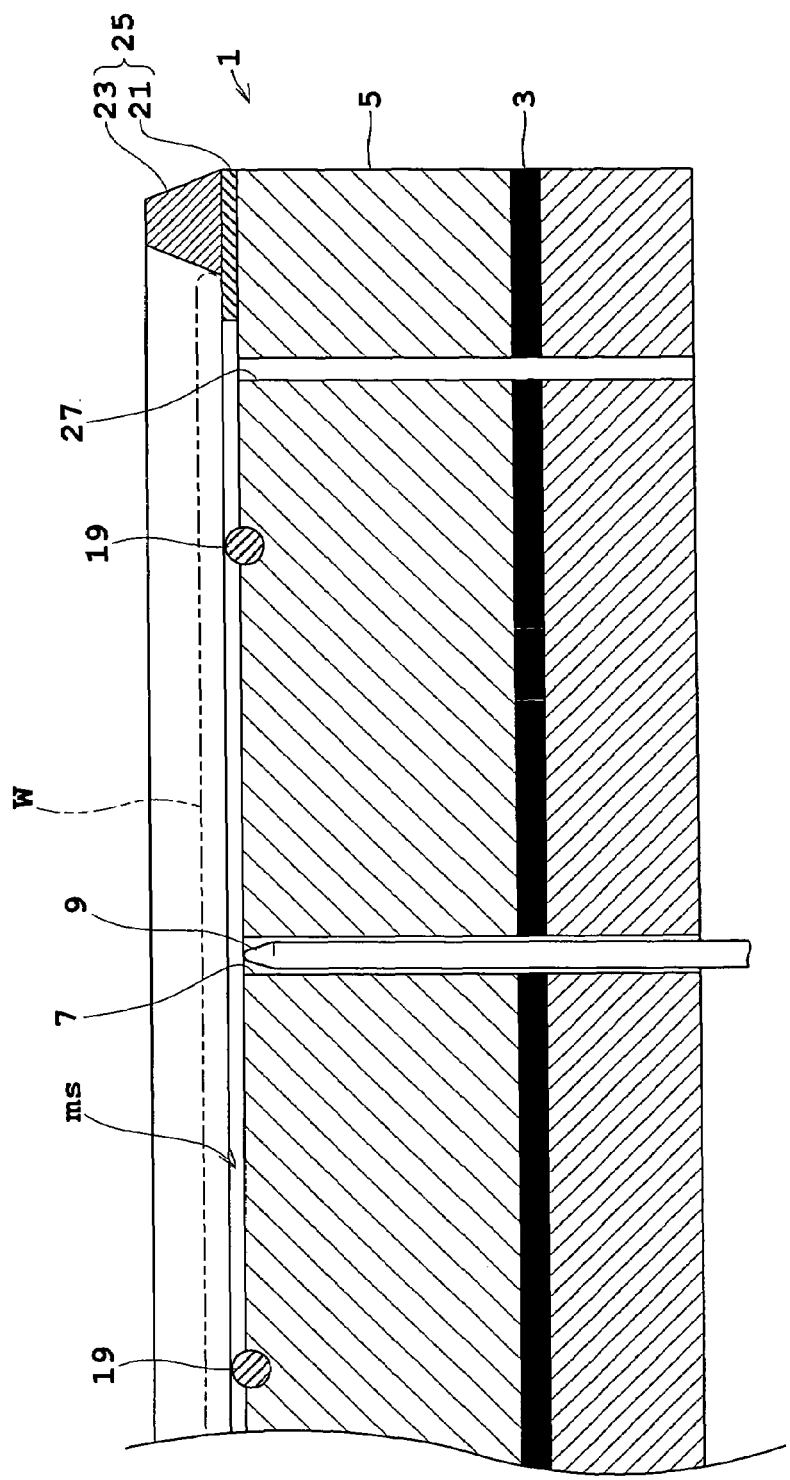
FIG. 3 is an enlarged view in vertical section of a bake plate.

FIG. 1 is a view in vertical section showing an outline of a substrate heat treatment apparatus in Embodiment 1. FIG. 2 is a plan view of the apparatus shown in FIG. 1. FIG. 3 is an enlarged view in vertical section of a bake plate.

A bake plate 1 for supporting a substrate or wafer W on an upper surface thereof has a heating element 3 such as a mica heater mounted in a lower portion thereof. A heat transfer portion 5 between the heating element 3 and the upper surface of bake plate 1 has a plurality of heat pipes, not shown, embedded therein. Cooling grooves, not shown, are formed between the heat pipes for circulating a cooling fluid.

The bake plate 1 has three perforations 7 extending from the upper surface to the lower surface. These perforations 7 are formed in positions corresponding to the apexes of an equilateral triangle in plan view, each having a support pin 9 inserted therein. Each support pin 9 has a lower end disposed on a support member 11, and a lower region thereof laterally surrounded by a bellows 13 fixed to the upper surface of support member 11 and the lower surface of bake plate 1. The support member 11 is attached to a lift arm 17 connected to a working rod of an air cylinder 15. Thus, when the air cylinder 15 is operated, the lift arm 17 is raised to cause each support pin 9 to project upward from the upper surface of bake plate 1 (as indicated by two-dot chain lines in FIG. 1). When the air cylinder 15 is made inoperative, the working rod is retracted to lower the lift arm 17. Then, each support pin 9 is withdrawn down from the upper surface of bake plate 1 (as indicated by solid lines in FIG. 1). This operation allows a wafer W to be transferred to and from a transport device not shown.

The upper surface of bake plate 1 has seven recesses formed, clear of the perforations 7, in the central position, in positions corresponding to the apexes of an equilateral triangle, and in positions on extensions from the central position through the positions corresponding to the apexes. Balls 19 of slightly larger diameter than the depth of the recesses are fitted in the recesses. Further, three recesses are formed similarly in positions on extensions from the central position through the perforations 7, and balls 19 are fitted in these recesses. When a wafer W is placed on the bake plate 1, these ten balls 19 support the wafer W, forming a minute space "ms" called a proximity gap from the upper surface of bake plate 1 (see FIG. 3). Thus, the wafer W can be heated uniformly by radiant heat from the upper surface of bake plate 1. The number and positions of balls 19, which correspond to the projections in this invention, may be set appropriately according to the diameter of wafer W, for example.

The bake plate 1 has a support portion 21, ring-shaped in plan view, disposed at the periphery of the upper surface thereof and having a thickness substantially corresponding to a minute height to which the balls 19 project from the upper surface of the bake plate 1. The support portion 21 has a regulator 23 mounted on the upper surface thereof, which is ring-shaped in plan view, and trapezoidal in vertical section. The support portion 21 contacts the periphery of the lower surface of wafer W, and supports the lower surface to be level with the height of minute space "ms". The regulator 23 restricts sideways displacements of the wafer W. These support portion 21 and regulator 23 constitute a seal assembly 25 for closing lateral areas of minute space "ms".

Preferably, the above seal assembly 25 is formed of polyimide resin having a heat-resisting property and elasticity, for example. Alternatively, for example, Teflon resin may be used.

The bake plate 1 has exhaust bores 27 formed in three positions between the outermost balls 19 and the seal assembly 25 and opening to the upper surface of the plate 1. The exhaust bores 27 are connected to ends of exhaust piping 29 which is connected at the opposite end to a vacuum suction source 31. This vacuum suction source 31 is a vacuum utility provided for a cleanroom, for example. The exhaust piping 29 has a switch valve 33 with a vacuum breaker, a flow regulating valve 35 and a pressure gauge 37 arranged in order thereon from upstream with respect to an exhaust gas flow toward the vacuum suction source 31. The flow regulating valve 35 is provided for setting beforehand a flow rate of gas discharged when the switch valve 33 is opened.

The heating element 3, air cylinder 15 and switch valve 33 noted above are controlled by a CPU 39. Their controls are carried out based on a recipe stored in memory 41. Regarding the switch valve 33 in particular, the CPU 39 performs control to open the switch valve 33 for suction of the gas through the exhaust piping 29, and control to close the switch valve 33 for stopping the suction and to cause the vacuum breaker to open, to atmospheric pressure, portions of the exhaust piping 29 upstream of the switch valve 33 and connected to the exhaust bores 27.

Figure 4:
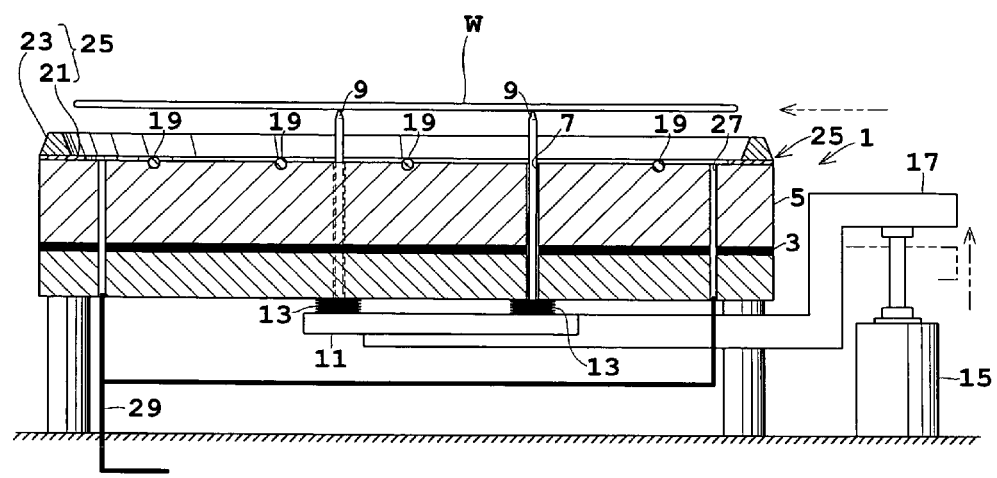
FIG. 4 is an explanatory view of a process of treating a substrate.
Figure 5:
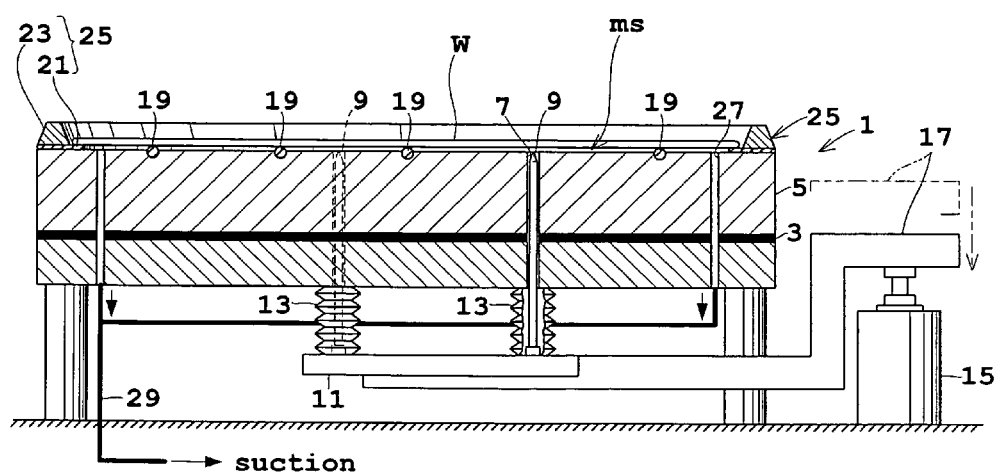
FIG. 5 is an explanatory view of the process of treating the substrate.
Figure 6:
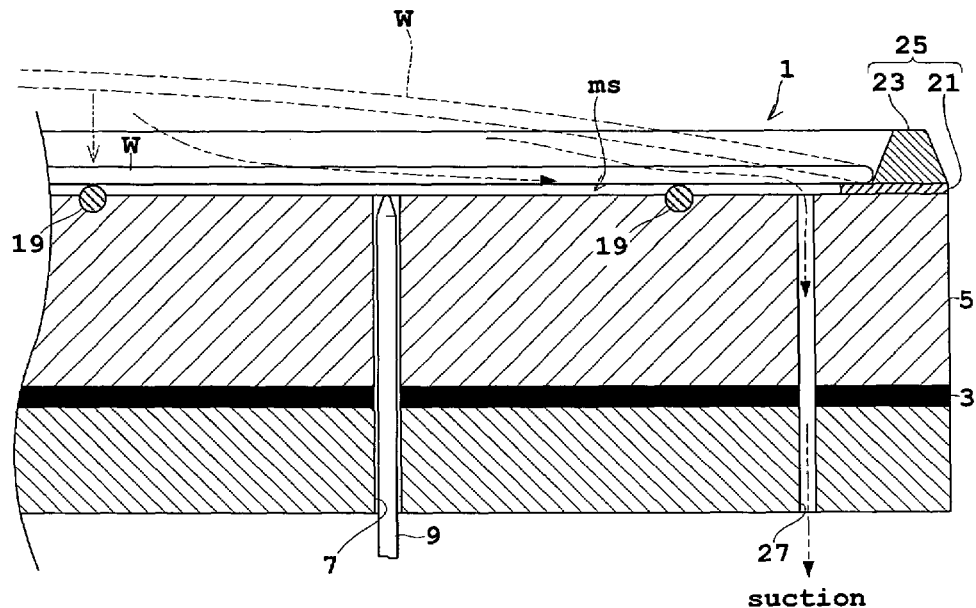
FIG. 6 is an explanatory view showing a process of treating a curved substrate with a central part thereof bulging upward.
Figure 7:
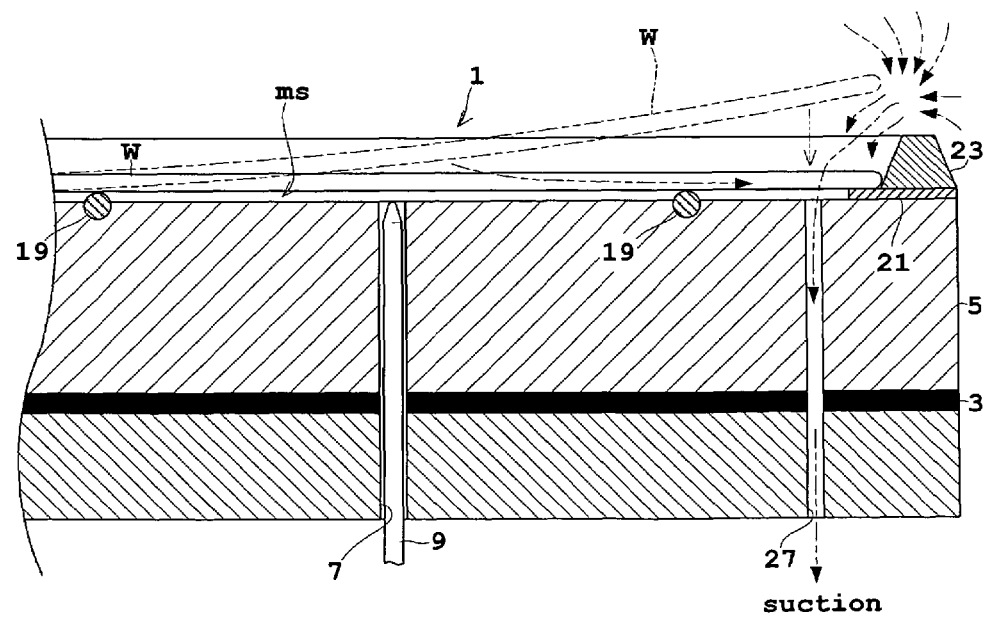
FIG. 7 is an explanatory view showing a process of treating a curved substrate with a central part thereof bulging downward.

Next, operation of the substrate heat treatment apparatus having the above construction will be described with reference to FIGS. 4 through 7. FIGS. 4 and 5 are explanatory views of a process of treating a substrate. FIG. 6 is an explanatory view showing a process of treating a curved substrate with a central part thereof bulging upward. FIG. 7 is an explanatory view showing a process of treating a curved substrate with a central part thereof bulging downward. Temperature control of the heating element 3 is performed according to the recipe, and is omitted from the following description.

First, the CPU 39 operates the air cylinder 15 to extend the working rod upward (FIG. 4). As a result, the three support pins 9 project upward from the upper surface of bake plate 1. At this time, the bellows 13 are contracted and compressed by the support member 11 and the lower surface of bake plate 1. In this state, a wafer W (e.g. in a state of an epitaxial layer for forming circuits and so on facing up) is received from the transport device not shown, and is supported in horizontal posture by the projecting support pins 9.

Subsequently, the CPU 39 stops the operation of the air cylinder 15 to retract the working rod (FIG. 5). As a result, the lower surface of the wafer W contacts the ten balls 19, and the periphery of the lower surface contacts the support portion 21. Further, the CPU 39 opens the switch valve 33, and exhausts gas (air or nitrogen) from the minute space "ms" at a fixed flow rate through the exhaust bores 27 and exhaust piping 29. This produces a negative pressure in the minute space "ms", whereby the wafer W supported by the balls 19 and support portion 21 is drawn toward the bake plate 1. Consequently, the wafer W, if at all curved, is leveled by the negative pressure, and the lower surface of the wafer W in contact with the balls 19 and support portion 21 is maintained at an appropriate distance to the upper surface of bake plate 1. The wafer W in this state may receive uniform heat treatment over the entire surface.

The curvature of wafer W includes a case where, as shown in FIG. 6, the wafer W is curved to have the central part bulging upward (dome-like curvature), and a case where, as shown in FIG. 7, the wafer W is curved to have the central part bulging downward (bowl-like curvature). When the wafer W is curved to have the central part bulging upward, the central part of wafer W is drawn toward the upper surface of bake plate 1 by the negative pressure produced by the gas being exhausted from the minute space "ms" by suction. As a result, the entire surface of wafer W is placed close to the upper surface of bake plate 1 across the minute space "ms". When the wafer W is curved to have the central part bulging downward, the periphery warps upward. The suction will cause gas to flow in from outside the periphery, producing Bernoulli effect to draw the periphery of wafer W downward. As a result, the entire surface of wafer W is likewise placed close to the upper surface of bake plate 1 across the minute space "ms". Thus, regardless of the direction of curvature, the wafer W may be appropriately placed adjacent the upper surface of bake plate 1.

Since the central part of wafer W is easily curved by suction, when the central part is drawn first to form a closed space, the negative pressure in the minute space "ms" adjacent the periphery of wafer W may remain low. Then, there is a possibility that the periphery of wafer W is not fully drawn. However, this embodiment is free from such an inconvenience since the exhaust bores 27 are formed outwardly from the central part of bake plate 1. The entire surface of wafer W is drawn substantially equally, so that uniform heat treatment may be performed.

After placing the wafer W as described above, the wafer W is maintained in the stated state for a predetermined time to receive predetermined heat treatment.

Upon lapse of the predetermined time of heat treatment, the CPU 39 closes the switch valve 33 to stop discharge of the gas from the minute space "ms", and operates the vacuum breaker of the switch valve 33. As a result, gas flows into the minute space "ms" to cancel the suction of the wafer W toward the bake plate 1. Subsequently, the air cylinder 15 is operated to extend the working rod, thereby to raise the wafer W. In this state, the transport device not shown unloads the wafer W from the apparatus.

Thus, according to this substrate heat treatment apparatus, a negative pressure is produced in the minute space "ms" by exhausting gas from the minute space "ms" through the exhaust bores 27, whereby the surface of wafer W is drawn toward the bake plate 1. Any curvature of the wafer W is thereby corrected, and the lower surface of wafer W is brought into contact with the balls 19 to be maintained at an appropriate distance to the upper surface of bake plate 1. Thus, the apparatus can perform uniform heat treatment over the entire surface of wafer W.

Embodiment 2

Figure 8:
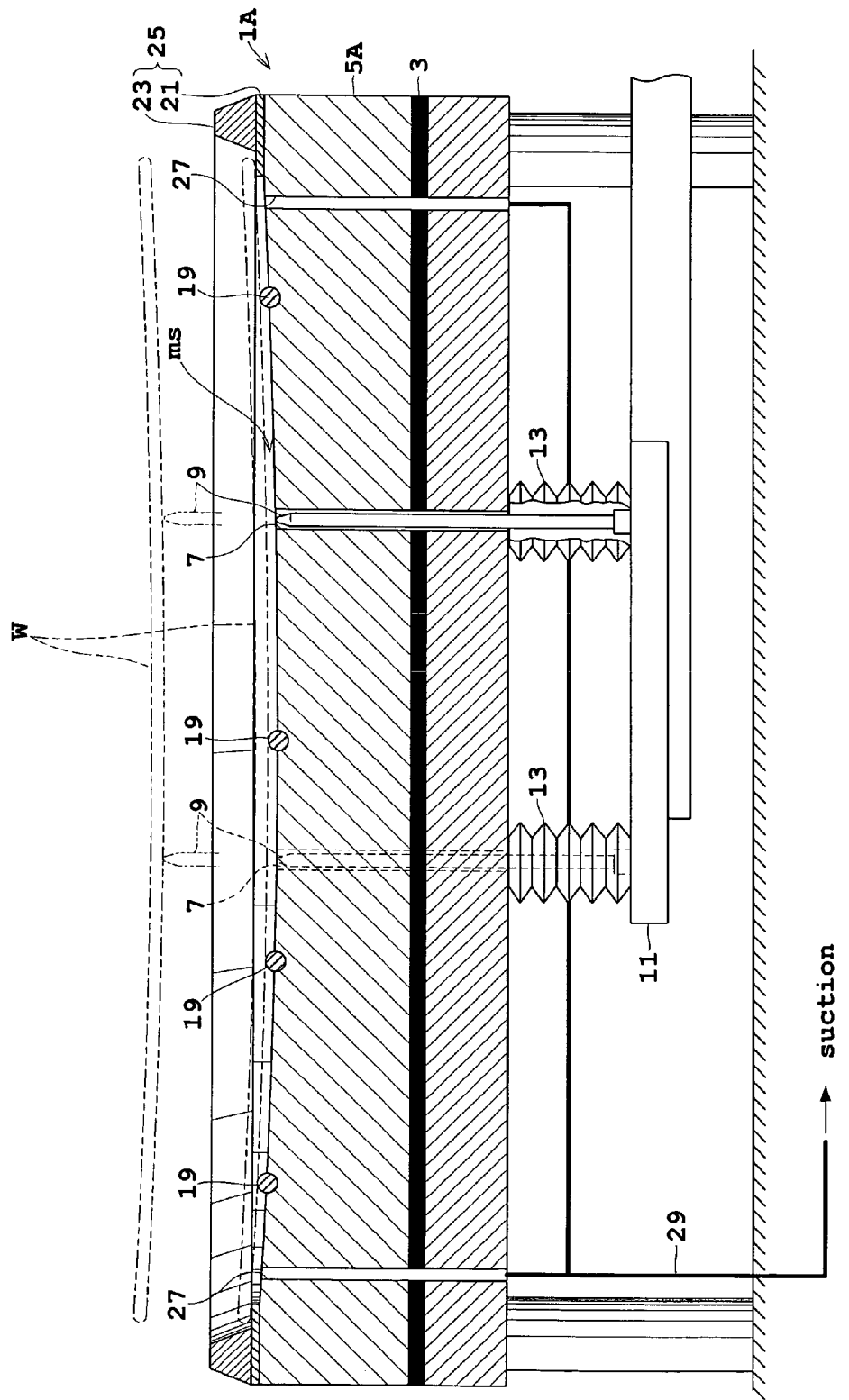
FIG. 8 is a view in vertical section showing an outline of a substrate heat treatment apparatus in Embodiment 2.

Next, Embodiment 2 of this invention will be described with reference FIG. 8. FIG. 8 is a view in vertical section showing an outline of a substrate heat treatment apparatus in Embodiment 2. In the following description, like reference numerals are used to identify like parts which are the same as in Embodiment 1 and will not particularly be described.

Embodiment 2 relates to an improvement made in the upper surface of bake plate 1A.

Specifically, the upper surface of bake plate 1A, and more particularly the upper surface of heat transfer portion 5A inwardly of the seal assembly 25, is recessed in a shape of shallow concave around the center. When the wafer W is curved to have the central part bulging downward from the periphery (bowl-like curvature), the central part may be drawn first, with only insufficient suction acting on the periphery. The recessed shape of the upper surface of bake plate 1A allows the periphery of wafer W to be fully drawn. Thus, regardless of curvature, the wafer W may receive uniform heat treatment over the entire surface. With this bake plate 1A employed, it is also possible to treat a wafer W curved to have the central part bulging upward (dome-like curvature).

Embodiment 3

Figure 9:
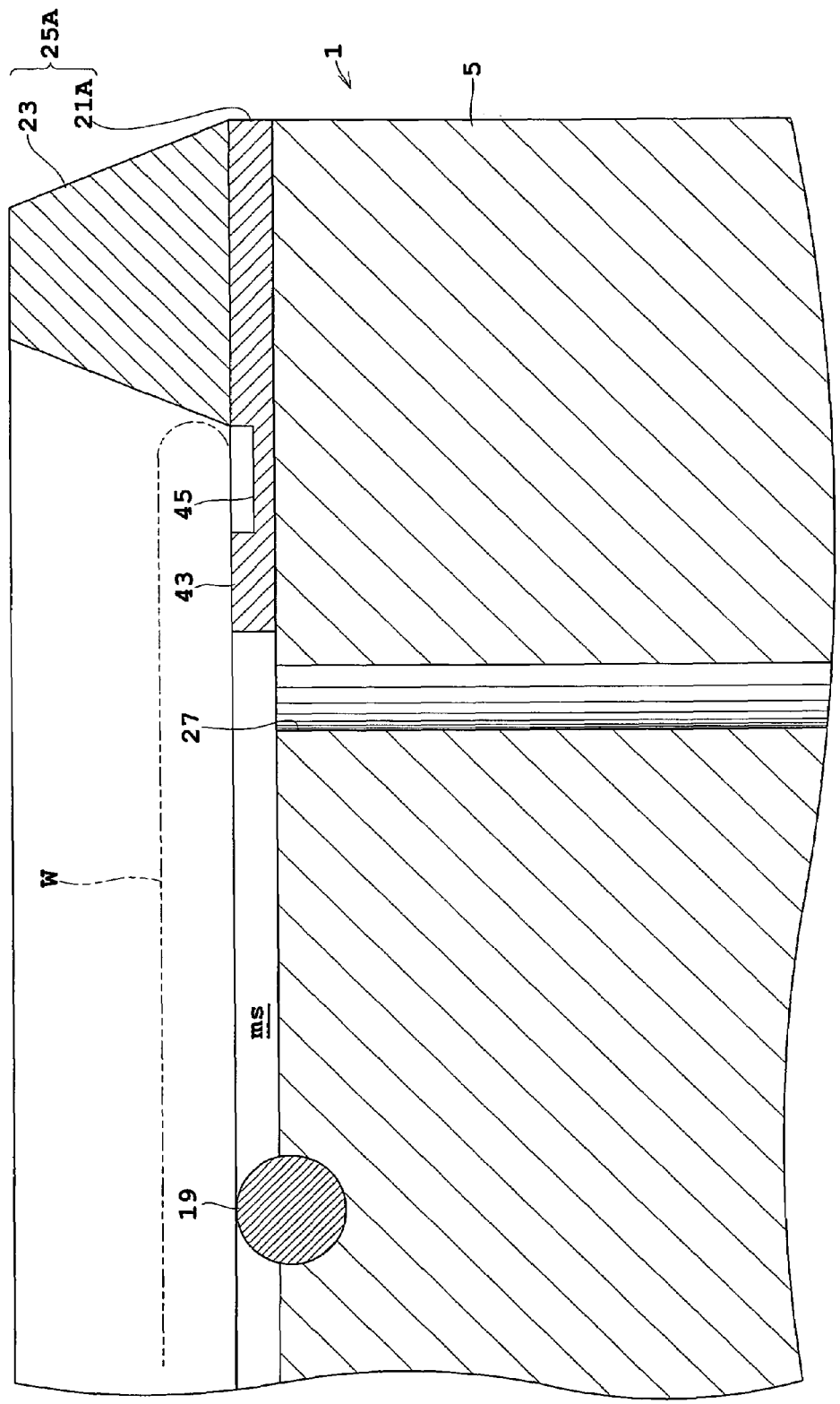
FIG. 9 is an enlarged view in vertical section of a portion of a substrate heat treatment apparatus in Embodiment 3.

Next, Embodiment 3 of this invention will be described with reference FIG. 9. FIG. 9 is an enlarged view in vertical section of a portion of a substrate heat treatment apparatus in Embodiment 3. Like reference numerals are used to identify like parts which are the same as in Embodiment 1 described hereinbefore, and will not particularly be described.

Embodiment 3 is different from Embodiments 1 and 2 in the construction of a seal assembly 25A.

Specifically, the seal assembly 25A includes a support portion 21A and a regulator 23. The support portion 21A has a contact portion 43 and a groove 45. The contact portion 43 has an inside diameter slightly smaller than the outside diameter of wafer W, and an upper surface thereof contactable with a portion of the lower surface of wafer W slightly inward from the edge. The groove 45 is located outwardly of the contact portion 43 and does not contact the lower surface of wafer W.

When the wafer W is placed in the substrate heat treatment apparatus having the above construction, the support portion 21A of seal assembly 25A supports the periphery of the lower surface of wafer W at the height of balls 19, and the regulator 23 restricts sideways movement of wafer W, thereby preventing displacements of wafer W. Further, there is a possibility that the treating liquids and other substances from various processes have flowed round to and remain on the periphery of the lower surface of wafer W. When the wafer W is sucked with such liquids and substances adhering to the support portion 21A, it may be difficult to separate the periphery of wafer W from the support portion 21A upon cancellation of the suction. In this embodiment, however, the contact portion 43 smaller than the outside diameter of wafer W contacts and supports the lower surface of wafer W, and the groove 45 maintains, out of contact, the periphery of the lower surface of wafer W possibly having the liquids and substances. Consequently, the wafer W is readily separable from the seal assembly 25A even if the treating liquids and the like remain adhering to the periphery of the lower surface of wafer W.

The contact portion 43 may be formed of a plurality of concentric circles each having a triangular shape in vertical section with one vertex located at the top. This construction will assure improved gastightness.

Embodiment 4

Figure 10:
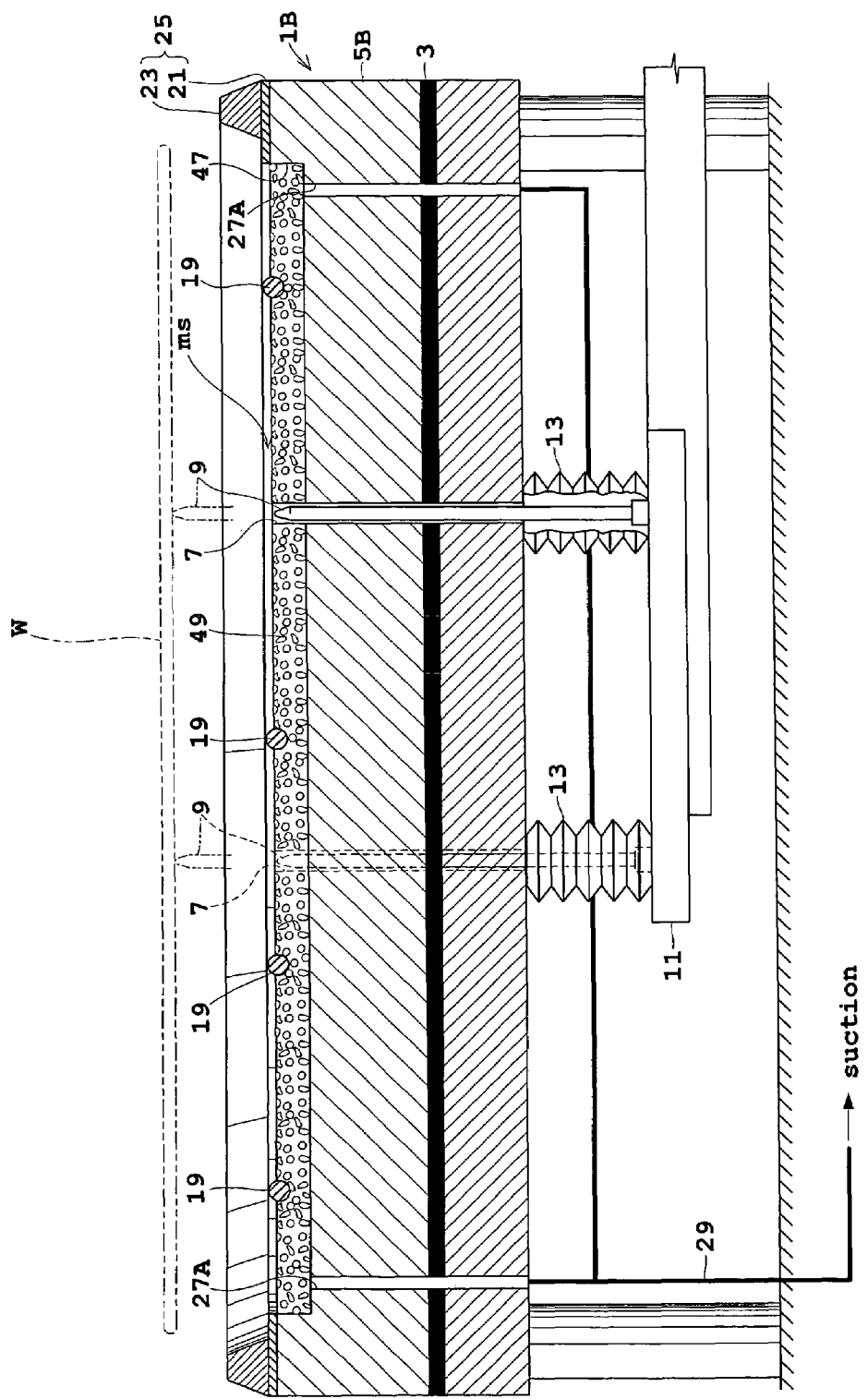
FIG. 10 is a view in vertical section showing an outline of a substrate heat treatment apparatus in Embodiment 4.

Next, Embodiment 4 of this invention will be described with reference FIG. 10. Like reference numerals are used to identify like parts which are the same as in Embodiment 1 described hereinbefore, and will not particularly be described. FIG. 10 is a view in vertical section showing an outline of a substrate heat treatment apparatus in Embodiment 4.

The heat transfer portion 5B of bake plate 1B has a shallow recess 47 forward inwardly of the seal assembly 25. A porous member 49 of the open cell type is disposed in this recess 47. The recess 47 has exhaust bores 27A formed therein and opening to the upper surface and lower surface of the bake plate 1B.

With such construction, the seal assembly 25 closes the side areas of minute space "ms" between the lower surface of wafer W and the upper surface of bake plate 1B. When gas is exhausted from the minute space "ms" through the exhaust bores 27A, a negative pressure is produced by the gas leaving an entire expanse under the minute space "ms" through the porous member 49. The negative pressure draws the wafer W toward the bake plate 1B. Thus, any curvature of wafer W is leveled, so that the lower surface of wafer W contacts the balls 19 to be maintained at an appropriate distance to the upper surface of bake plate 1B, whereby uniform heat treatment is effected over the entire surface of wafer W. Moreover, since the exhaust is effected in a planar form through the porous member 49, the gas is exhausted generally and evenly from the minute space "ms". As a result, an uneven heat distribution is little likely to occur with the bake plate 1B, thereby realizing heat treatment of increased uniformity.

This embodiment may be combined with one or more of Embodiments 1-3 described above and Embodiments 5-8 to follow.

Embodiment 5

Figure 11:
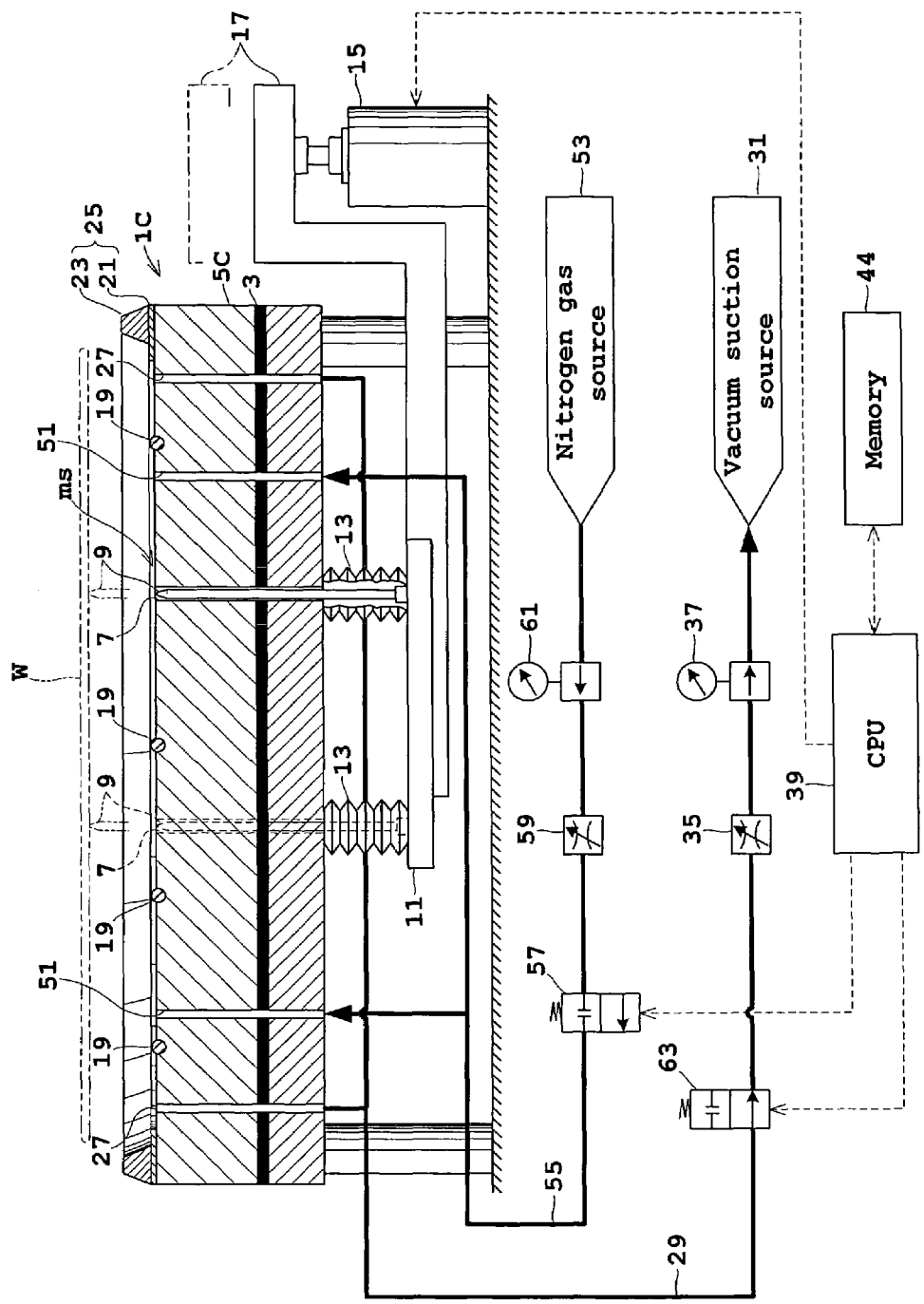
FIG. 11 is a view in vertical section showing an outline of a substrate heat treatment apparatus in Embodiment 5.

Next, Embodiment 5 of this invention will be described with reference FIG. 11. Like reference numerals are used to identify like parts which are the same as in Embodiment 1 described hereinbefore, and will not particularly be described. FIG. 11 is a view in vertical section showing an outline of a substrate heat treatment apparatus in Embodiment 5.

In this embodiment, the bake plate 1C has a plurality of feed bores 51. The feed bores 51 are connected to a nitrogen gas source 53 through feed piping 55. The feed piping 55 has a switch valve 57, a flow regulating valve 59 and a pressure gauge 61 arranged thereon. The nitrogen gas source 53 may be replaced with a clean air source. The CPU 39 controls opening and closing of the switch valve 57. The exhaust piping 29 has an ordinary switch valve 63 with no vacuum breaker in place of the switch valve 33 in Embodiment 1 described hereinbefore.

In this embodiment, the switch valve 63 is opened by the CPU 39 to exhaust gas from the minute space "ms" at a fixed flow rate through the exhaust bores 27. Then, a negative pressure is produced in the minute space "ms", whereby the wafer W supported by the balls 19 and support portion 21 is drawn toward the bake plate 1C (heat transfer portion 5C). This state is maintained for a predetermined time according to the recipe, to effect heat treatment. Upon lapse of the predetermined time, the CPU 39 first opens the switch valve 57 to feed nitrogen gas into the minute space "ms" at a fixed flow rate through the feed bores 51, and closes the switch valve 63 to stop the suction.

When a gas were supplied or the atmosphere were allowed to enter through the exhaust bores 27 having exhausted the gas from the minute space "ms", in order to cancel the suction in the minute space "ms" and release the wafer W as described above, particles and the like could be blown upward toward the lower surface of wafer W to contaminate the wafer W. However, this embodiment provides the feed bores 51 separately from the exhaust bores 27. When canceling the suction, the negative pressure in the minute space "ms" is positively canceled by first supplying the gas through the feed bores 51 and thereafter the exhaust through the exhaust bores 27 is stopped. This process effectively prevents the blowing-up of particles and the like, thereby treating the wafer W in a highly clean condition.

By the influence of the treating liquids having flowed round to the lower surface of wafer W, the wafer W may stick to the seal assembly 25 making it difficult to raise the wafer W with the support pins 9 even after the negative pressure is canceled. In this embodiment, however, the gas is positively supplied to apply a pressure in the direction for raising the wafer W, whereby the wafer W is easily raised by the support pins 9.

Embodiment 6

Figure 12:
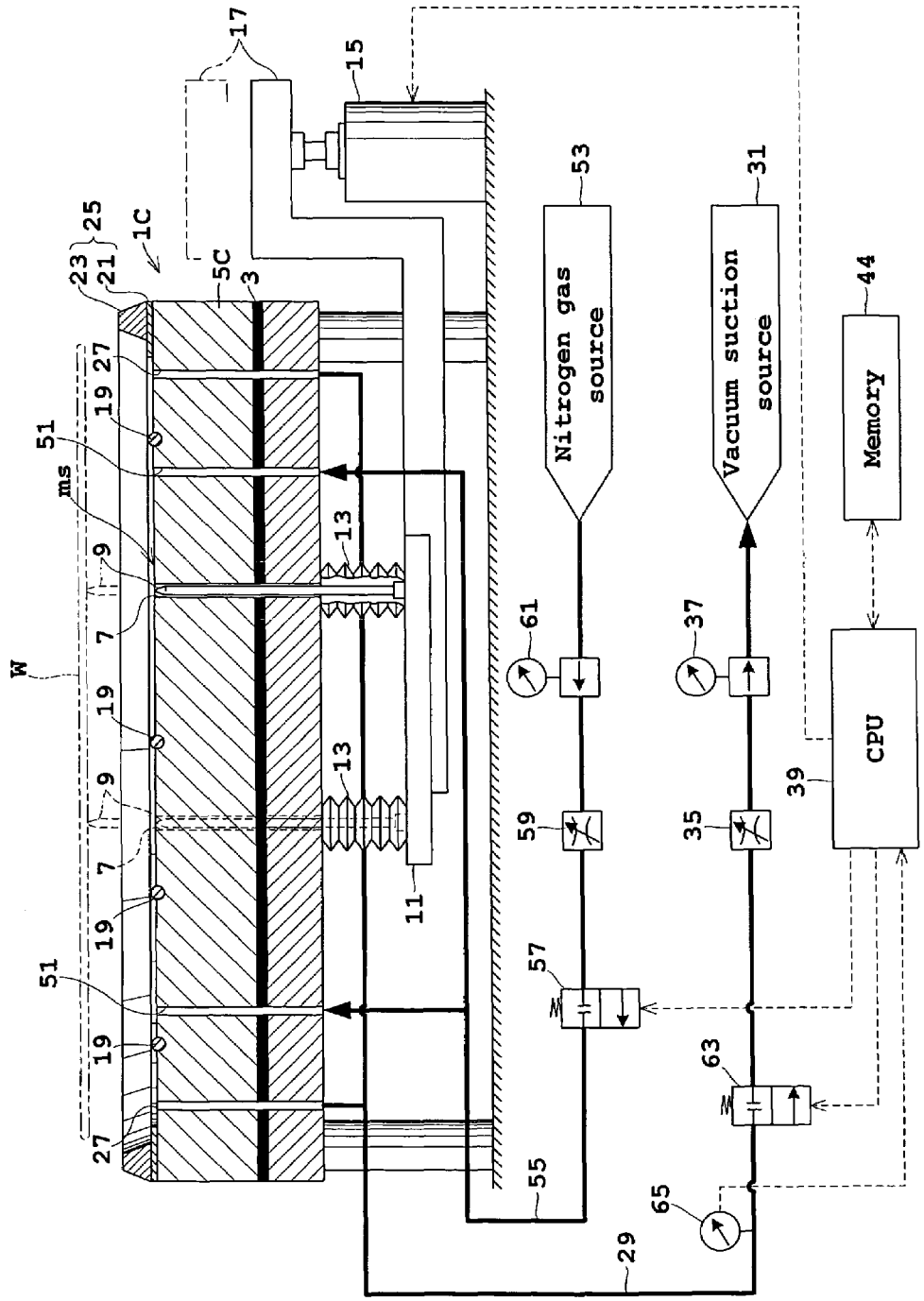
FIG. 12 is a view in vertical section showing an outline of a substrate heat treatment apparatus in Embodiment 6.

Next, Embodiment 6 of this invention will be described with reference the drawings. Like reference numerals are used to identify like parts which are the same as in Embodiment 5 described above, and will not particularly be described. FIG. 12 is a view in vertical section showing an outline of a substrate heat treatment apparatus in Embodiment 6.

In this embodiment, the exhaust piping 29 has a pressure gauge 65 disposed upstream (close to the exhaust bores 27) of the switch valve 63, and its pressure values are monitored by the CPU 39. The pressure gauge 65 corresponds to the exhaust pressure detecting device in this invention. The CPU 39 corresponds to the determining device and reporting device in this invention.

Figure 13:
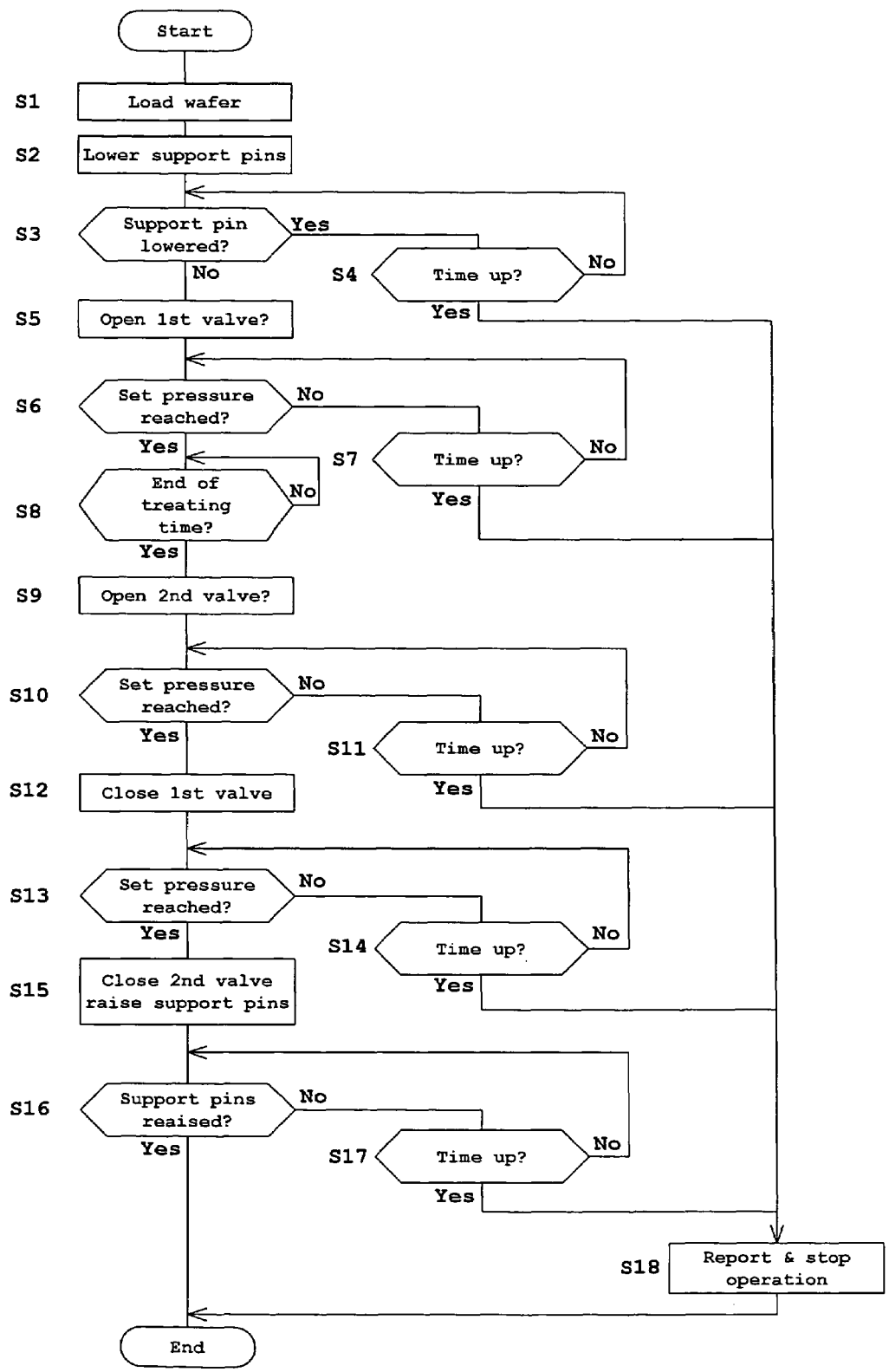
FIG. 13 is a flow chart of operation of Embodiment 6.

Operation of this apparatus will be described with reference to FIG. 13. FIG. 13 is a flow chart illustrating the operation of the apparatus in Embodiment 6.

Step S1

A wafer W is loaded into the apparatus. The air cylinder 15 is operated to raise the support pins 7 and receive the wafer W.

Steps S2-S4

The air cylinder 15 is made inoperative to retract the working rod and lower the support pins 7. As a result, the wafer W is placed on the bake plate 1C. The CPU 39 checks whether the support pins 7 have been lowered normally by referring to a sensor not shown (step S3). The CPU 39 monitors the sensor until the support pins 7 have been lowered normally (step S4).

Steps S5-S7

After confirming that the wafer W is in place, the CPU 39 opens the switch valve 63 (first valve), monitors the pressure gauge 65 over a fixed period of time to determine whether the pressure has reached a set pressure, and branches off the process. That is, different processes will follow when the minute space "ms" fails to be decompressed to a set pressure due to a trouble such as damage to the wafer W or seal assembly 25, and when the minute space "ms" is decompressed to the set pressure with no trouble having occurred.

Step S8

When the decompression to the predetermined pressure has been attained, the wafer W undergoes heat treatment for a treating time based on the recipe.

Steps S9-S11

Upon lapse of the treating time, the switch valve 57 (second valve) is opened. As a result, nitrogen gas is supplied to the minute space "ms" and the exhaust piping 29 communicating therewith. The CPU 39 monitors the pressure of the pressure gauge 65 over a fixed period of time to determine whether a set pressure is reached, and branches off the process. That is, different processes will follow when the nitrogen gas cannot be supplied sufficiently due, for example, to a fault or abnormality of the nitrogen gas supply system, thereby failing to cancel the negative pressure, and when the negative pressure is successfully canceled without any trouble occurring.

Steps S12-S14

When the set pressure is reached and the negative pressure is canceled, the switch valve 63 (first valve) is closed to stop the exhaust operation. The CPU 39 monitors the pressure of the pressure gauge 65 over a fixed period of time, determines whether the set pressure is reached, and branches off the process. That is, after closing the switch valve 63 of the exhaust system, the CPU 39 monitors the pressure over a fixed period of time to check whether the nitrogen gas supply has caused a pressure increase in the minute space ms and the portions communicating therewith, and branches off the process according to the result. Since nitrogen gas is supplied in order to cancel the negative pressure, the wafer W can be easily raised with the support pins 7 even when, for example, the periphery of the lower surface of wafer W has stuck to the support portion 21.

Steps S15-S17

After the set pressure is reached, the CPU 39 closes the switch valve 57 to stop the nitrogen gas supply, and operates the air cylinder 15 to raise the support pins 7. The CPU 39 checks whether the support pins 7 have been raised normally by referring to the sensor not shown, and branches off the process according to the result.

The above series of processes constitutes treatment of one wafer W. When time expires in each of steps S4, S7, S11, S14 and S17, the process branches to step S18. In step S18, the CPU 39 discontinues the operation, and reports to the operator that a certain fault occurred to the apparatus. To make this report, a lamp is blinked and/or a buzzer is sounded, for example. In this way, a fault is detected, the operation is stopped, and the trouble is reported. The operator will know beforehand a situation where the heat treatment of wafer W becomes uneven because the minute space cannot be maintained at a sufficient negative pressure due to an abnormality of the exhaust system. This prevents improper treatment being performed continuously. It is possible to detect and report a fault not only of the exhaust system but also of the supply system. Since the vertical movement of the support pins 9 is also monitored, a fault may be detected of the lift system as well as the exhaust and supply systems.

Embodiment 7

Figure 14:
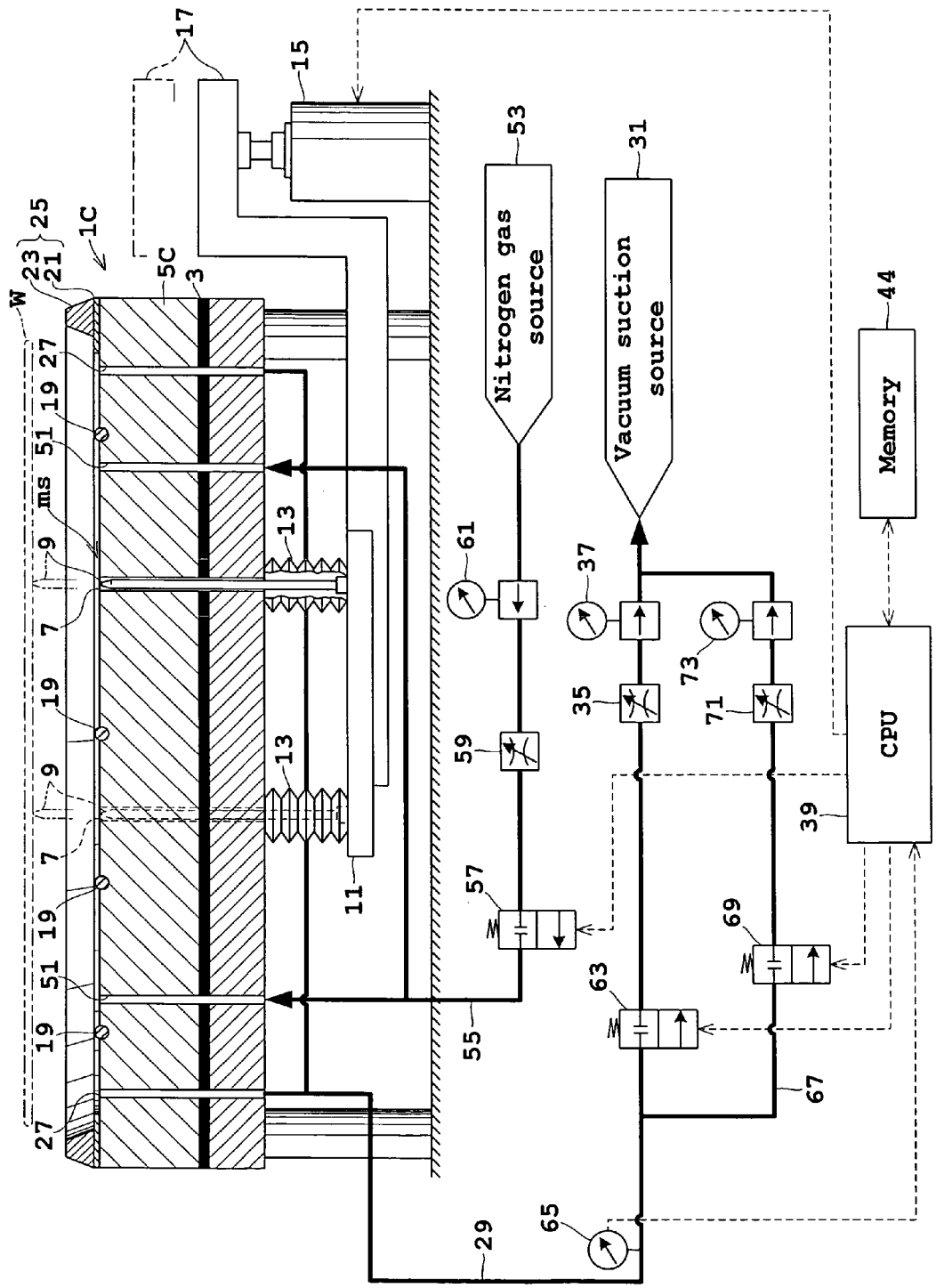
FIG. 14 is a view in vertical section showing an outline of a substrate heat treatment apparatus in Embodiment 7.

Next, Embodiment 7 of this invention will be described with reference the drawings. Like reference numerals are used to identify like parts which are the same as in Embodiment 6 described above, and will not particularly be described. FIG. 14 is a view in vertical section showing an outline of a substrate heat treatment apparatus in Embodiment 7.

The apparatus in this embodiment is characterized in that the exhaust gas pressure in the exhaust system is changed between two levels.

Specifically, the exhaust piping 29 has an exhaust pipe 67 branched off between the pressure gauge 65 and switch valve 63. The exhaust pipe 67 has a switch valve 69, a flow regulating valve 71 and a pressure gauge 73 arranged thereon. The flow regulating valve 71 is set to a higher flow rate (higher exhaust pressure) than the flow regulating valve 35. The CPU 39 switches the switch valves 63 and 69 after an interval of time, thereby to switch the exhaust pressure between two levels as described below.

The switch valves 63 and 69 and flow regulating valves 35 and 71 correspond to the switching device in this invention.

Figure 15:
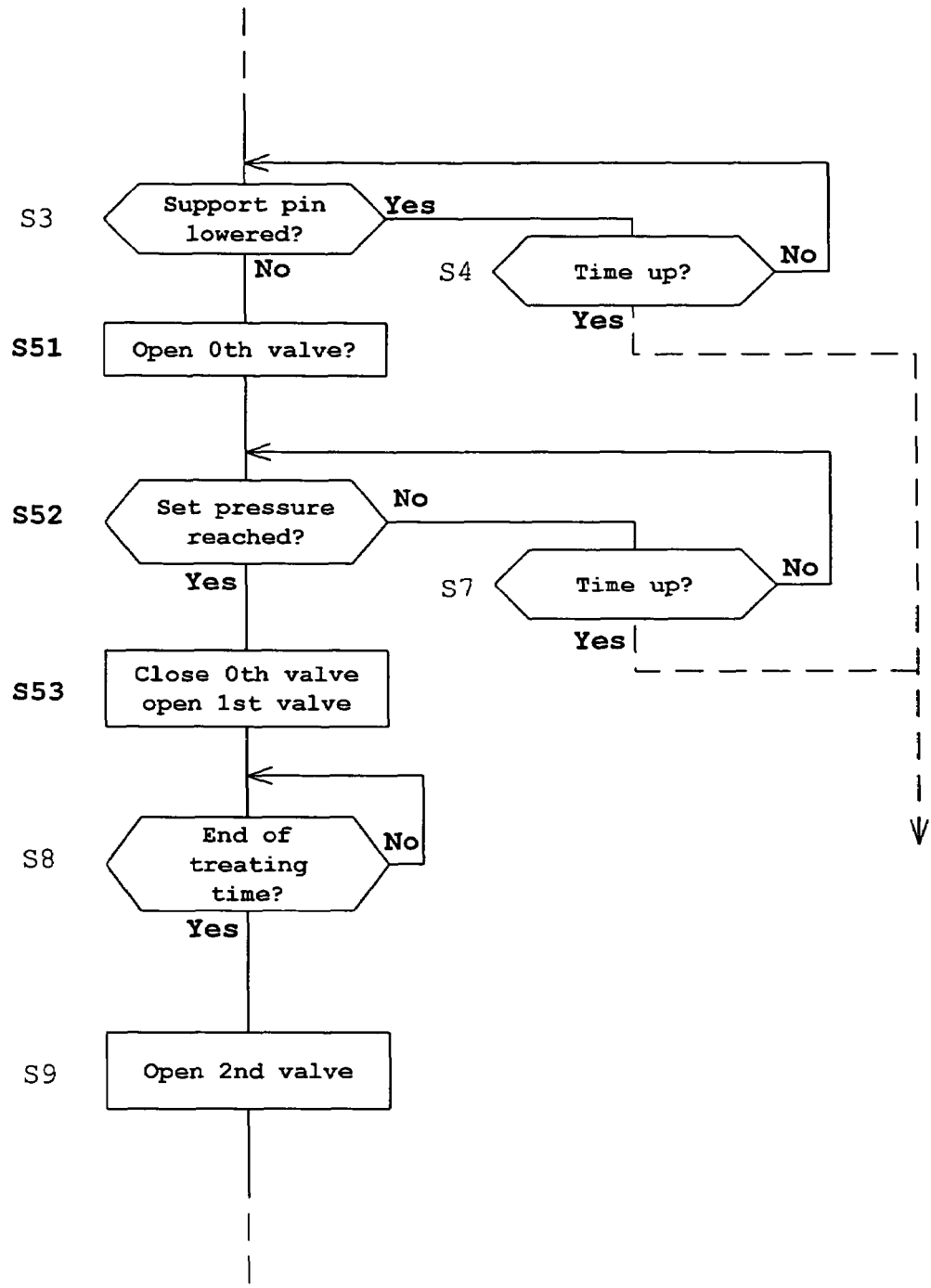
FIG. 15 is a flow chart of part of operation of Embodiment 7.

Operation of this apparatus will be described with reference to FIG. 15. FIG. 15 is a flow chart of part of operation of Embodiment 7. This flow chart is a replacement for the part of the flow chart of Embodiment 6 described above (FIG. 13) relating to the operation for exhausting gas from the minute space "ms" (steps S5 and S6). Thus, the operation described below follows the confirmation that the support pins 9 have been lowered.

Steps S51 and S52

The switch valve 69 (zeroth valve) is opened to exhaust the gas from the minute space "ms" under a relatively high pressure. A checking is made whether the pressure of the pressure gauge 65 has reached a set pressure. When the set pressure has been reached, the operation moves to step S53. Otherwise, the operation branches to step S7 et seq.

Step S53

The switch valve 69 (zeroth valve) is closed, and the switch valve 63 (first valve) is opened. This starts a gas exhaust under a lower exhaust pressure than when the switch valve 69 is opened. The subsequent process is the same as in Embodiment 6.

In this embodiment, the exhaust pressure is switched between two levels for exhausting the gas from the minute space "ms". This arrangement has the following advantage.

The greater exhaust pressure results in the greater suction applied to the wafer W. However, a gas flow at a high flow rate could make the heat distribution over the bake plate 1 uneven. On the other hand, when the wafer W is curved to have the periphery located higher than the central part, a large gap is formed between the seal assembly 25 and the periphery of wafer W. Unless the exhaust pressure is increased, the periphery of wafer W may not be sucked sufficiently. Thus, the exhaust pressure is increased to be higher in early stages of exhaust than the subsequent exhaust pressure in time of steady state. This exhaust mode can reliably suck even a wafer W curved to have the central part thereof bulging downward, and yet has no adverse influence on the heat distribution of bake plate 1.

Embodiment 8

Next, Embodiment 8 of this invention will be described with reference FIG. 16. Like reference numerals are used to identify like parts which are the same as in Embodiments 1-7 described above, and will not particularly be described. FIG. 16 is an enlarged view in vertical section of a portion of a substrate heat treatment apparatus in Embodiment 8.

Where, as in Embodiment 1 described hereinbefore, the exhaust bores 27 open to the upper surface of bake plate 1, suction may easily be applied to the lower surface of wafer W to draw the wafer toward the bake plate 1. This realizes an efficient sucking action. However, the invention is not limited to such exhaust bores. The exhaust bores may be varied as long as the gas is exhausted from the minute space "ms". The following arrangement may be employed, for example.

In Embodiment 8, the heat transfer portion 5D of bake plate 1D does not have the exhaust bores (27). Instead, a plurality of exhaust bores 27B are arranged under the support portion 21B of the seal assembly 25. Each exhaust bore 27B defines a passage having a semi-circular sectional shape. However, since the minute space "ms" is decompressed, the support portion 21B at the periphery of the lower surface of wafer W is pressed down to the bake plate ID. It is therefore preferable to set the shape and number of bores to have enough strength not to deform under the pressure. Part of the bores may be used for feeding nitrogen, instead of using all the bores for the exhausting purpose.

Since the heat transfer portion 5D does not have the exhaust bores (27), the heat distribution of bake plate 1D may be made more uniform, and besides the curvature of wafer W may be corrected to receive uniform heat treatment.

This invention is not limited to the foregoing embodiments, but may be modified as follows:

(1) In each embodiment described above, the balls 19 are used to form the minute space "ms". Instead, for example, the upper surface of the heat transfer portion 5 of the bake plate 1 may be etched, partially plated or partially coated to be uneven in the form of concentric circles or meshes. Such parts prepared separately may be bonded to the upper surface of heat transfer portion 5.

(2) In each embodiment described above, heat pipes are embedded in the heat transfer portion 5. The invention is applicable also to a substrate heat treatment apparatus having no heat pipes.

(3) In each embodiment described above, the substrates are shaped circular in plan view. The invention is applicable also to a substrate heat treatment apparatus for treating rectangular substrates.

This invention may be embodied in other specific forms without departing from the spirit or essential attributes thereof and, accordingly, reference should be made to the appended claims, rather than to the foregoing specification, as indicating the scope of the invention.

What is claimed is:

1. A substrate heat treatment apparatus for heat-treating a substrate, comprising:
   a bake plate having projections on an upper surface thereof;
   a seal unit disposed peripherally of the upper surface of said bake plate for closing a lateral area of a minute space formed between a lower surface of the substrate and the upper surface of said bake plate when the substrate is placed on said bake plate, said seal unit including a regulator for restricting sideways movement of the substrate and a contact portion having a diameter smaller than an outside diameter of the substrate and spaced from said regulator for contacting the lower surface of the substrate; and
   exhaust bores for exhausting gas from said minute space;
   wherein the substrate placed on said bake plate is heat-treated in a state of the gas exhausted from said minute space through said exhaust bores.

2. An apparatus as defined in claim 1, wherein said exhaust bores open to the upper surface of said bake plate.

3. An apparatus as defined in claim 2, wherein said exhaust bores are formed in positions closer to said seal unit than to a central part of said bake plate.

4. An apparatus as defined in claim 1, wherein said bake plate has a recessed shape with the upper surface recessed downward.

5. An apparatus as defined in claim 1, wherein said seal unit has a groove formed outwardly of the contact portion and between said regulator and said contact portion for remaining out of contact with the lower surface of the substrate.

6. An apparatus as defined in claim 2, wherein said seal unit has a groove formed outwardly of the contact portion and between said regulator and said contact portion for remaining out of contact with the lower surface of the substrate.

7. An apparatus as defined in claim 3, wherein said seal unit has a groove formed outwardly of the contact portion and between said regulator and said contact portion for remaining out of contact with the lower surface of the substrate.

8. An apparatus as defined in claim 1, further comprising feed bores for feeding a gas to said minute space, wherein the gas is fed from said feed bores and the exhaust from said exhaust bores is stopped after finishing heat treatment of the substrate.

9. An apparatus as defined in claim 2, further comprising feed bores for feeding a gas to said minute space, wherein the gas is fed from said feed bores and the exhaust from said exhaust bores is stopped after finishing heat treatment of the substrate.

10. An apparatus as defined in claim 3, further comprising feed bores for feeding a gas to said minute space, wherein the gas is fed from said feed bores and the exhaust from said exhaust bores is stopped after finishing heat treatment of the substrate.

11. An apparatus as defined in claim 1, further comprising:
    an exhaust pressure detecting device for detecting an exhaust pressure in said exhaust bores;
    a determining device for determining an abnormality of an exhaust system based on the exhaust pressure obtained from said exhaust pressure detecting device; and
    a reporting device for reporting the abnormality determined by said determining device.

12. An apparatus as defined in claim 1, further comprising a switching device for switching an exhaust pressure from said exhaust bores, such that an exhaust pressure from said minute space is increased to be higher in early stages of exhaust than a subsequent exhaust pressure in time of steady state.

13. A substrate heat treatment apparatus for heat-treating a substrate, comprising:
    a bake plate having projections on an upper surface thereof;
    a seal unit disposed peripherally of the upper surface of said bake plate for closing a lateral area of a minute space formed under a lower surface of the substrate when the substrate is placed on said bake plate, said seal unit including a regulator for restricting sideways movement of the substrate and a contact portion having a diameter smaller than an outside diameter of the substrate and spaced from said regulator for contacting the lower surface of the substrate;
    a porous member disposed on the upper surface of said bake plate inwardly of said seal unit; and
    exhaust bores communicating with said porous member for exhausting gas from said minute space;
    wherein the substrate placed on said bake plate is heat-treated in a state of the gas exhausted from said minute space through said exhaust bores.

14. An apparatus as defined in claim 13, wherein said exhaust bores open to the upper surface of said bake plate.

15. An apparatus as defined in claim 13, wherein said seal unit has a groove formed outwardly of the contact portion and between said regulator and said contact portion for remaining out of contact with the lower surface of the substrate.

16. An apparatus as defined in claim 14, wherein said seal unit has a groove formed outwardly of the contact portion and between said regulator and said contact portion for remaining out of contact with the lower surface of the substrate.

17. An apparatus as defined in claim 13, further comprising feed bores for feeding a gas to said minute space, wherein the gas is fed from said feed bores and the exhaust from said exhaust bores is stopped after finishing heat treatment of the substrate.

18. An apparatus as defined in claim 14, further comprising feed bores for feeding a gas to said minute space, wherein the gas is fed from said feed bores and the exhaust from said exhaust bores is stopped after finishing heat treatment of the substrate.

19. An apparatus as defined in claim 13, further comprising:
    an exhaust pressure detecting device for detecting an exhaust pressure in said exhaust bores;
    a determining device for determining an abnormality of an exhaust system based on the exhaust pressure obtained from said exhaust pressure detecting device; and
    a reporting device for reporting the abnormality determined by said determining device.

20. An apparatus as defined in claim 13, further comprising a switching device for switching an exhaust pressure from said exhaust bores, such that an exhaust pressure from said minute space is increased to be higher in early stages of exhaust than a subsequent exhaust pressure in time of steady state.

* * * * *